(12) United States Patent
Combs et al.

(10) Patent No.: US 6,523,801 B2
(45) Date of Patent: Feb. 25, 2003

(54) COMPONENT PLACEMENT

(75) Inventors: Christopher D. Combs, Portland, OR (US); Jay D. Hall, Forest Grove, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/826,560

(22) Filed: Apr. 4, 2001

(65) Prior Publication Data

US 2002/0171025 A1 Nov. 21, 2002

(51) Int. Cl.[7] .................................................. F16M 13/00
(52) U.S. Cl. ........................................................ 248/544
(58) Field of Search ................................ 248/694, 693, 248/613, 621, 544, 568, 346.01; 361/760, 734; 156/64

(56) References Cited

U.S. PATENT DOCUMENTS

| | | | | |
|---|---|---|---|---|
| 5,309,324 A | * | 5/1994 | Herandez et al. | 361/734 |
| 5,320,226 A | * | 6/1994 | Merrill | 206/521 |
| 6,189,876 B1 | * | 2/2001 | Frazier | 269/21 |
| 6,330,996 B1 | * | 12/2001 | Yo et al. | 248/694 |

OTHER PUBLICATIONS

US 2002/0029900 A1 Wimberger Friedl et al. Published Mar. 14, 2002.*
*Fuji CP–6 High Speed Chip Placer* brochure.
*Fuji Chip Placer CP–6* Specification. www.caro.net/disufj.htm.

* cited by examiner

Primary Examiner—Ramon O. Ramirez
(74) Attorney, Agent, or Firm—Fish & Richardson P.C.

(57) ABSTRACT

A compliant member configured to support a substrate during automated placement of components and a tray configured to support the compliant member and removably attach to a support member.

35 Claims, 9 Drawing Sheets

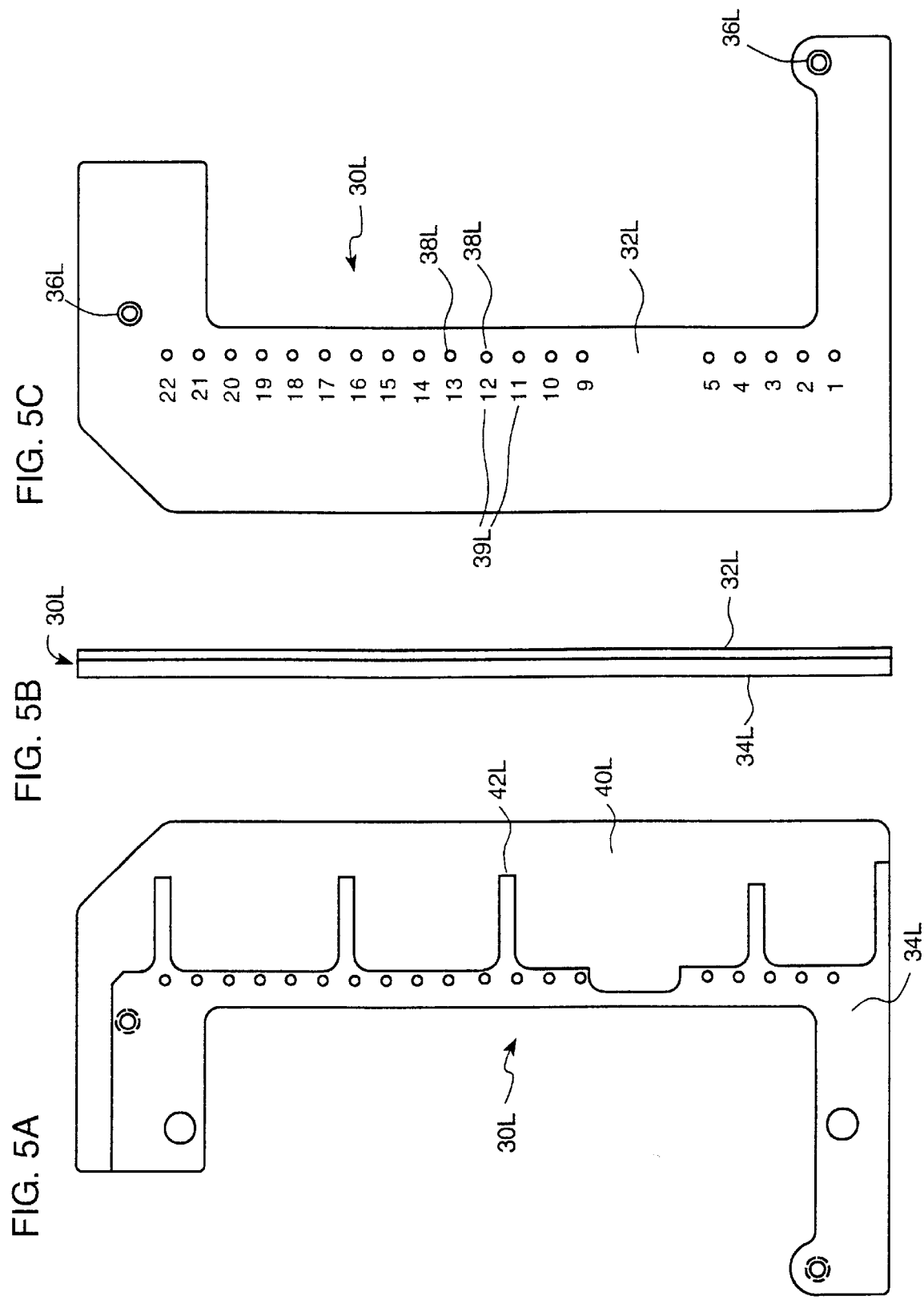

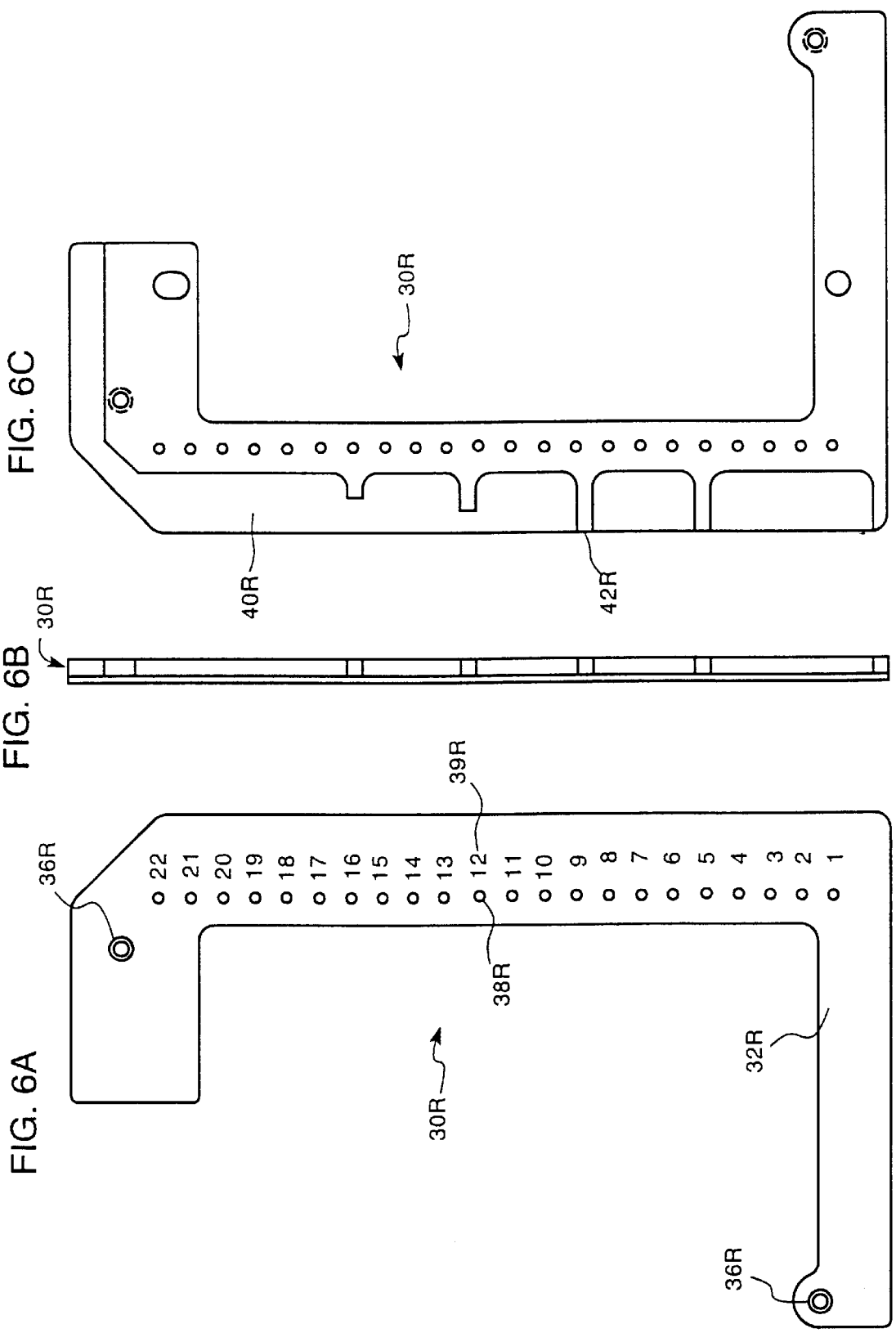

COMPONENT PLACEMENT

TECHNICAL FIELD

This invention relates to component placement.

BACKGROUND

In populating printed circuit boards (PCB), components are placed in solder paste on a board using high-speed automated equipment. The equipment typically includes a table capable of precise movement in an x-y plane and devices for placing components on PCBs that are held on the table using fixtures. One such component placement machine is the Fuji CP642 Chip Placer sold by Fuji North America, Vernon Hills, Ill.

Referring to FIG. 1, one way to hold a PCB 10 for placement of components 12 on a primary side 13 of the PCB is to support the board 10 on a secondary side 14 using an array of height-adjustable pins 15 attached to a phenolic plate 16 that is mounted on the x-y table 17 of the component placement machine (not shown).

The primary side of a PCB is the side on which components are placed first. The secondary side of a board may receive additional components after components on the primary side have been mounted.

Referring to FIG. 2, the height of each pin 15 may be adjusted independently during set-up before a manufacturing run. Typically, each pin is adjusted by hand and, as a result, the height of a given pin 15 may be adjusted incorrectly leaving gaps 18. The resulting inconsistent support may cause bending of board 10 and lead to damage of both PCB 10 and placed components 12, increasing manufacturing costs. When a pin is too high, the component placement machine may damage (e.g., crack) components 12 or PCB 10. When a pin is too low, a component may be seated improperly in the solder paste or not be placed at all. Setting the pins is time consuming.

DESCRIPTION OF DRAWINGS

FIGS. 5A, 5B, and 5C are bottom, left, and top views of a support plate.

FIGS. 6A, 6B, and 6C are top, right, and bottom views of a support plate.

DETAILED DESCRIPTION

Figure 1:
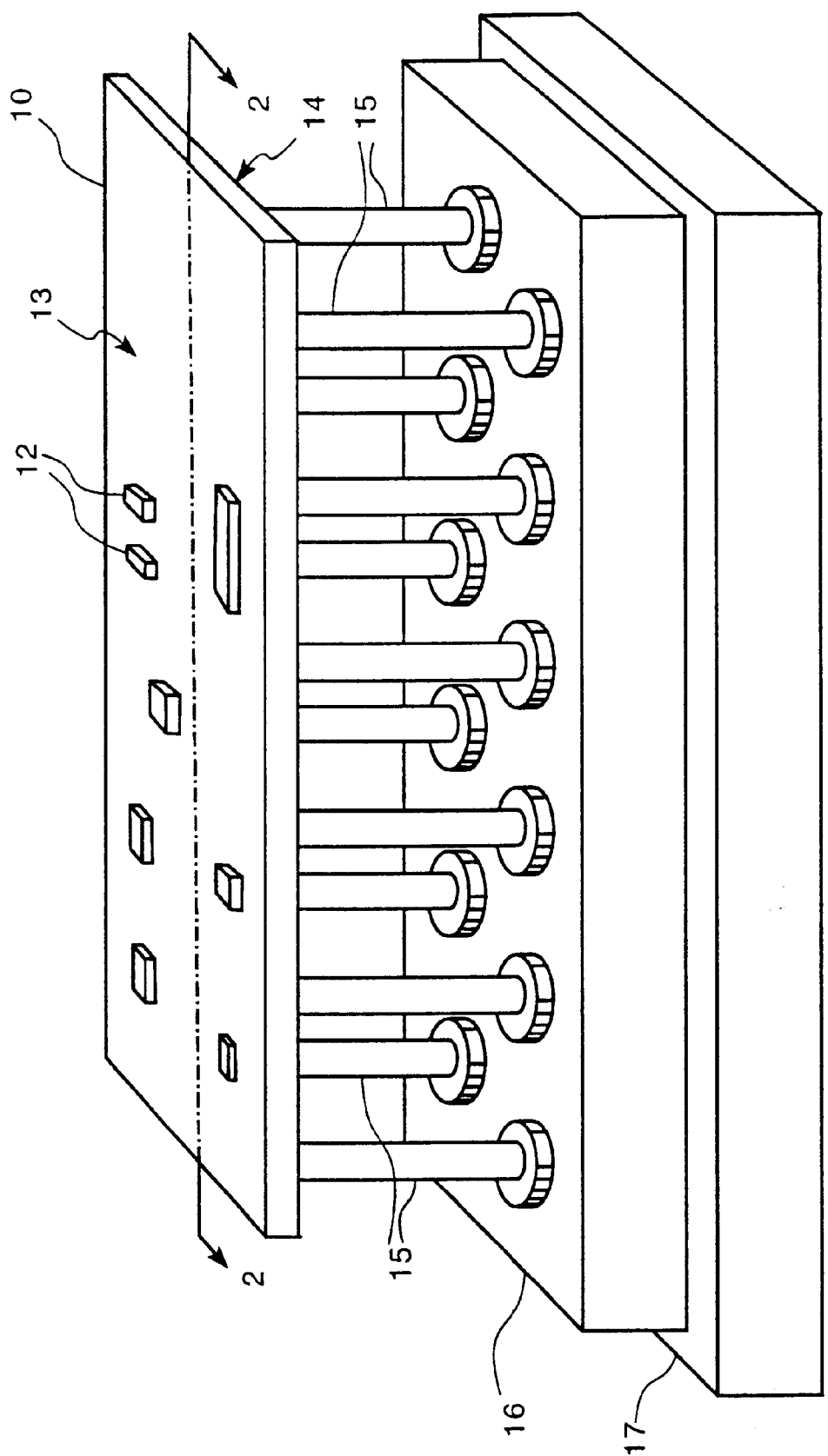
FIG. 1 is a perspective view of a known way of supporting a PCB during component placement.
Figure 2:
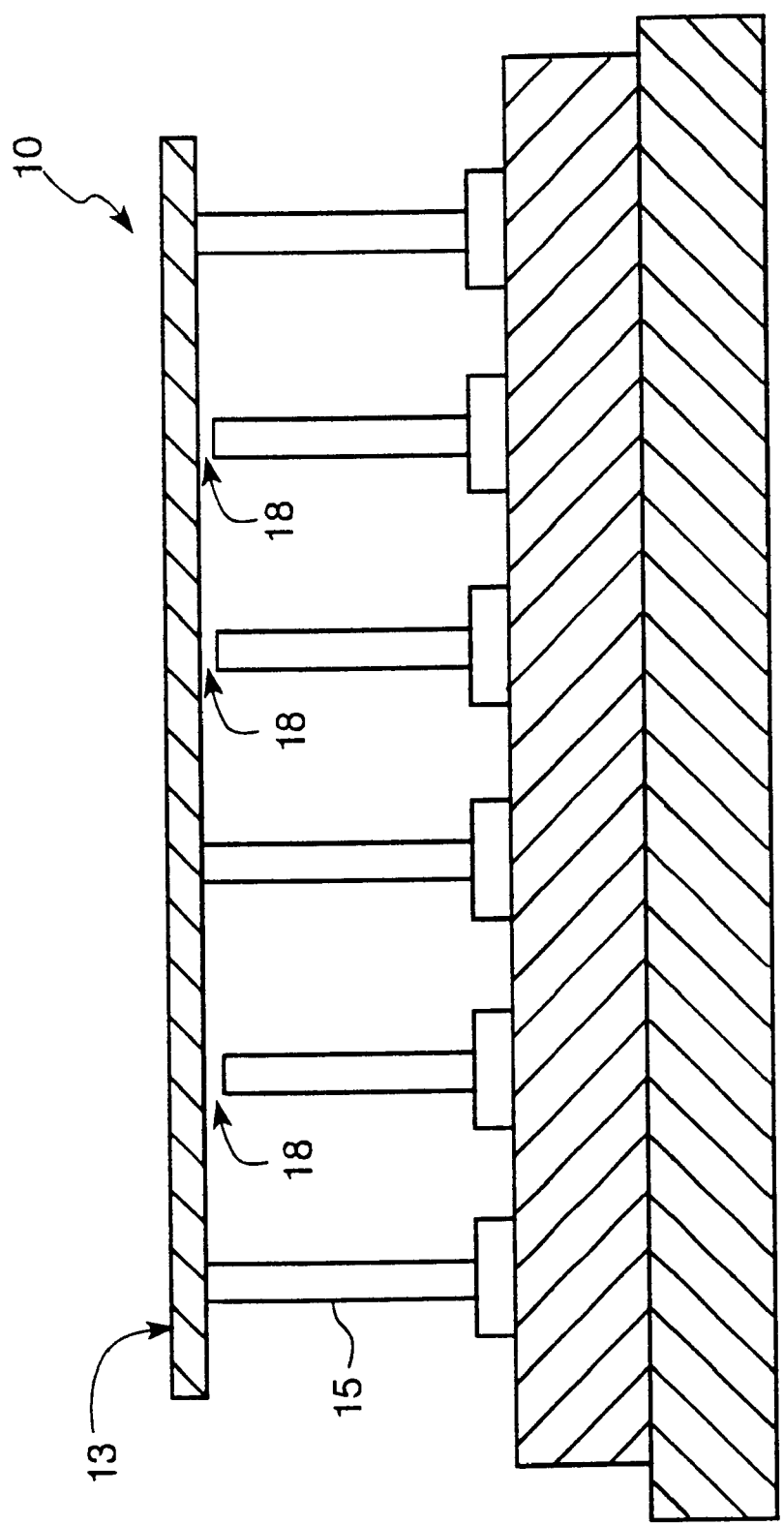
FIG. 2 is a section view of the known way shown in FIG. 1.
Figure 3:
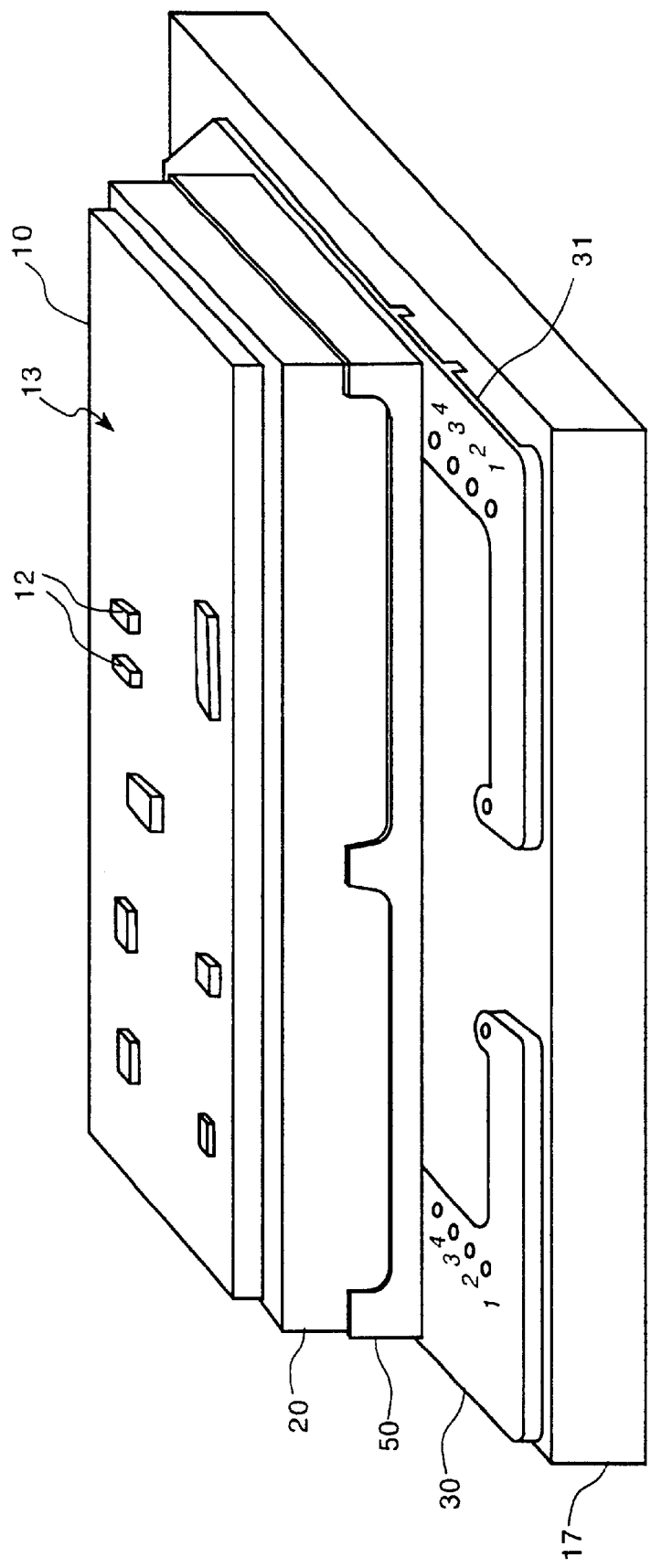
FIG. 3 is a perspective view of another way of supporting a PCB.

Another way to support a substrate 10 during placement of components 12 on primary side 13 is shown in FIG. 3. Substrate 10 lies flat on foam 20, which provides consistent and uniform support for substrate 10. Substrate 10 could be, but is not limited to, a fiberglass substrate, ceramic substrate, or mylar flex circuit substrate. In one example, foam 20 could be RP-80 electro-static dissipative polystyrene foam available from Packaging Resources, Inc. of Tualatin, Oreg. An electro-static dissipative foam dissipates potentially harmful electro-static charges that may build up during component placement. Foam 20 could be any shape or size necessary to support substrate 10 and position substrate 10 at a height for component placement. In one example, foam 20 could be a substantially rectangular block having dimensions of about 17.5 inches long, about 4 inches wide, and about 1.436 inches thick.

In some examples, foam 20 could be mounted to x-y table 17 using support tray 50 and one or more lightweight support plates 30, 31. In some examples, the pair of support plates are identical while, in other examples, the pair of support plates could have different designs to reduce the overall mass used to support substrate 10 and conform to x-y table 17. Support plates 30 could be attached to x-y table 17 using screws (not shown), for example. In some examples, support tray 50 is removably attached to support plates 30. In one example, support tray 50 is attached to plates 30 using flat head screws. In other examples, support tray 50 could be attached using touch fasteners (e.g., Velcro™) or magnets of opposing polarity mounted to tray 50 and plates 30. Foam 20 could be removably press fit into tray 50 in some examples, while in other examples foam 20 may be permanently attached to tray 50.

Figure 4A:
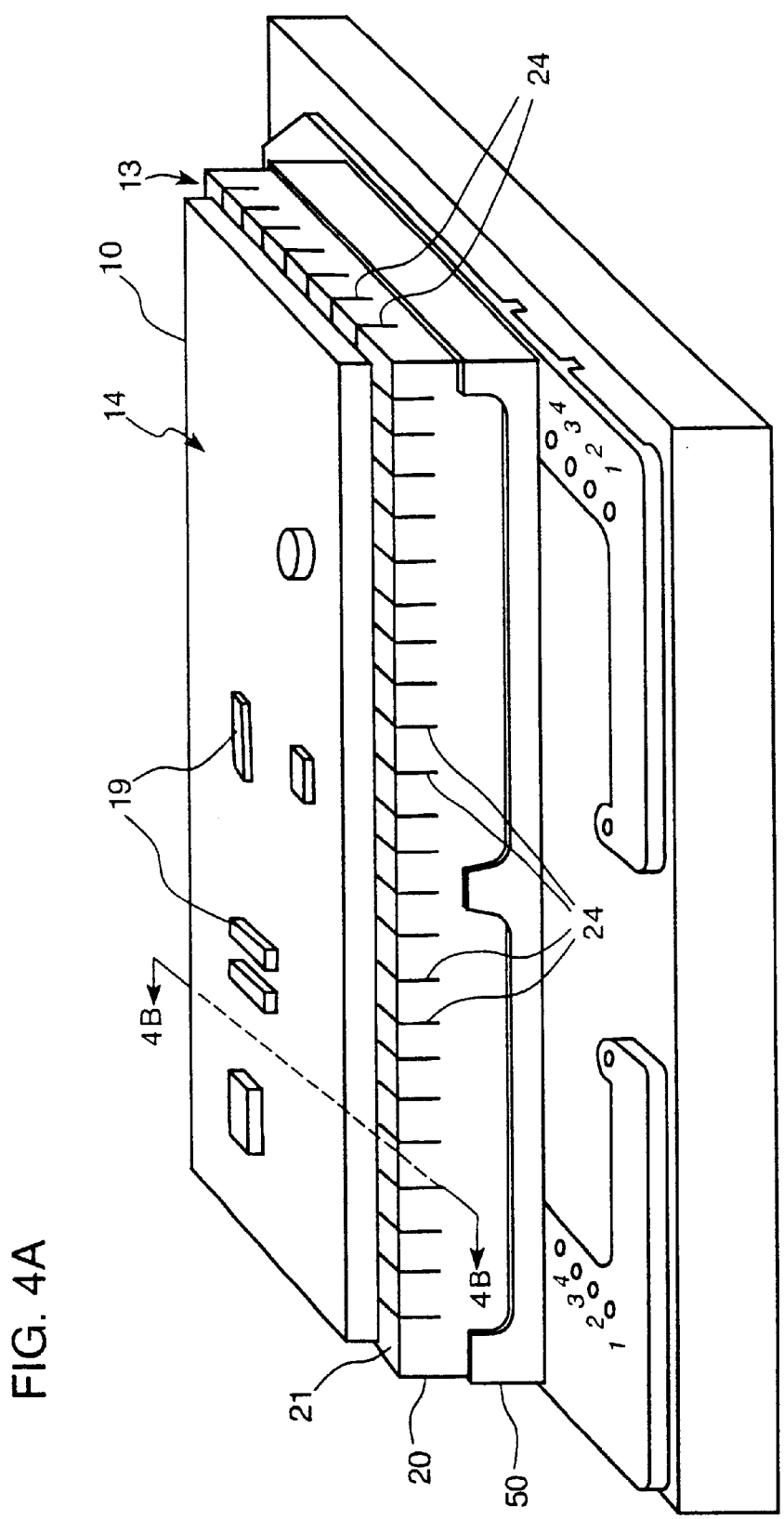
FIG. 4A is a perspective view of a way of supporting a PCB with components placed on its primary side.
Figure 4B:
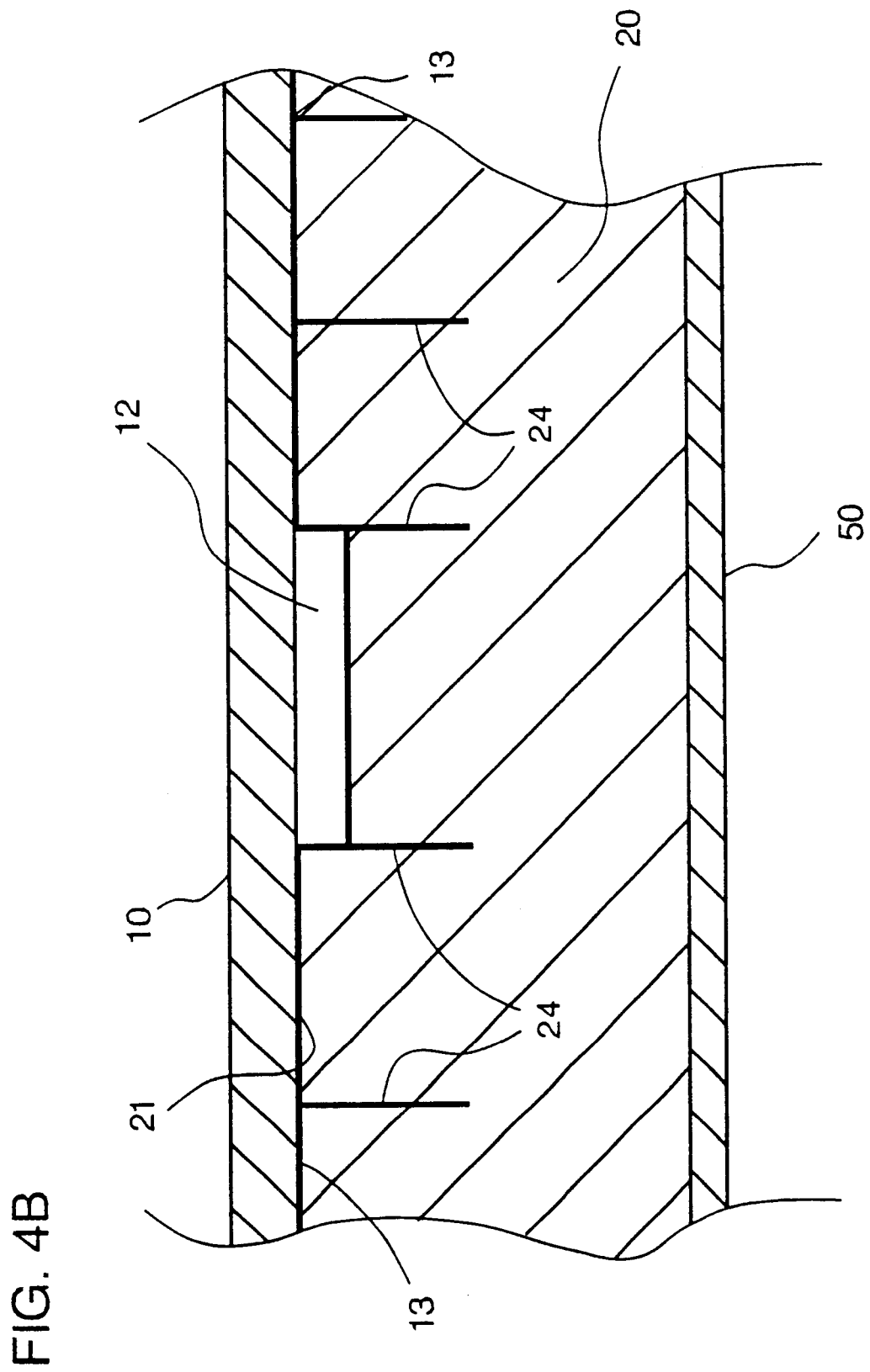
FIG. 4B is an exploded, partial sectional view of FIG. 4.

In some examples, foam 20 may also support substrate 10 during placement of components 19 on secondary side 14 of substrate 10, as shown in FIGS. 4A and 4B, by allowing components 12 located on primary side 13 (shown in FIG. 5) to compress foam 20 locally without bending substrate 10. In one example, surface 21 of foam 20 has a grid of cuts 24 to reduce the lateral forces internal to foam 20 and allow it to compress locally. Cuts 24 are made by removing material from foam 20 using a rotary blade having a thickness of about 0.052 inches. In one example, cuts 24 are about 0.75 inches deep and are spaced about 0.5 inches. Portions of the grid on surface 21 of foam 20 may also be removed to accommodate taller components 12.

Experiments have shown that using foam to support substrates resulted in lower defect rates and shorter set-up times. Table 1 shows data for four manufacturing runs placing components on the primary sides of printed circuit boards: two runs of "Koa" printed circuit boards and two runs of "Lancewood" printed circuit boards. One run for each board was performed using pin supports ("without foam"). Another run for each board used foam ("with foam"). Table 1 lists the number of boards manufactured in each run ("No. of Boards") and the rate of first-pass accepts (FPA) from the first post-soldering visual inspection ("PVSI #1 FPA"). Table 1 also lists defects per million calculations for a first pass of component placement on the top side of the boards ("SMT1 Placement DPM"). Defects per million are calculated by dividing the total number of defects by the total number of opportunities and multiplying them by 1,000,000. Total opportunities is the number of boards in the manufacturing run multiplied by the number of components to be placed on each board. The Koa board has 1,760 placed components while the Lancewood board has 1063 placed components.

TABLE 1

|  | Koa without foam | Koa with foam | Lancewood without foam | Lancewood with foam |
|---|---|---|---|---|
| No. of Boards | 3445 | 1400 | 53194 | 1457 |
| PSVI #1 FPA | 87.5% | 91.4% | 95.8% | 95.1% |
| SMT1 Placement DPM | 228 | 99 | 88 | 48 |
| Set-up time | 40 min. | 5 min. | 6 min. | 1.5 min. |

Table 2 shows data for two manufacturing runs placing components on the secondary sides of Koa PCBs.

TABLE 2

|  | Koa without foam | Koa with foam |
|---|---|---|
| No. of Boards | 6436 | 789 |
| PSVI FPA | 95.6% | 99.1% |
| SMT2 Placement DPM | 288 | 408/245 |
| Set-up time | 6 min. | 1.5 min. |

The defects per million for placement of components on the secondary side was higher for the foam supported boards (408 DPM) than for the pin supported boards (288 DPM). An inspection of failed boards for this manufacturing run revealed that 33 missing components were due to insufficient glue, a defect unrelated to board support. Not including the glue related defects, the defects per million for the foam supported boards was 245.

Referring to FIGS. 5A–6C, one example of a pair of support plates 30L and 30R are shown. Support plates 30 could be manufactured from 6061 T6 aluminum alloy or any other lightweight rigid material capable of holding a surface flat within a range of about 0.010 inches.

Support plate 30L is about 12.75 inches long about 7.55 inches wide and about 0.375 inches thick. Plate 30L has a flat top surface 32L for supporting tray 50 and a flat bottom surface 34L that contacts x-y table 17. Plate 30L has openings 36L to accommodate bolts that hold the plate to the x-y table 17. For example, holes 36L in plate 30L have diameters of about 0.24 inches and are counterbored about 0.22 inches deep from top surface 32 at a diameter of about 0.375 inches.

Plate 30L could also have features for securing tray 50 to plate 30L. In one example, plate 30L has a series of nineteen threaded holes 38L through plate 30L, each hole having a diameter of about 4 millimeters. Holes 38L are labeled to correspond with openings on plate 30R. Numbers 39L are engraved on top surface 32L for each hole 38L. Holes 38L and labels 39L between "5" and "9" are omitted due to the thickness of plate 30L at that location, which is reduced to accommodate belts in x-y table 17. The labeling of holes 38L plate 30L corresponds with similarly positioned holes 38R in plate 30R.

Plate 30L includes an area 40L of reduced thickness to accommodate x-y table 16 and to reduce the weight of plate 30L, resulting in less wear on table 16 over time. Area 40L has thicker areas, such as rib 42L for example, where plate 30L requires higher strength or stiffness. In one example, plate 30L is about 0.1 inches thick in area 40L.

Support plate 30R is about 12.75 inches long, about 8.13 inches wide, and about 0.375 inches thick. Support plate 30R has many of the same features as plate 30L described above and corresponding features are labeled with the same number followed by an "R".

Figure 7A:
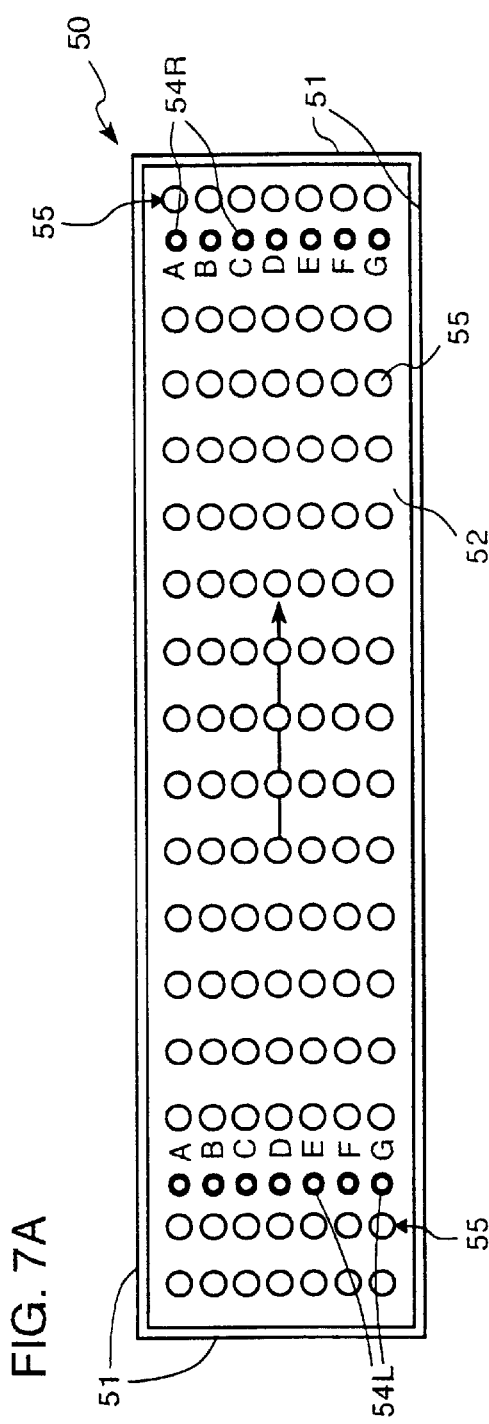
FIGS. 7A, 7B, and 7C are top, front, and right views of a support tray.
Figure 7B:
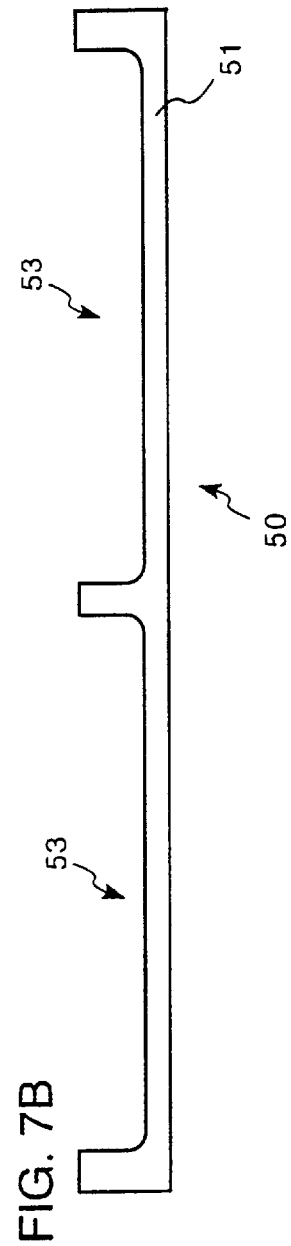
Figure 7C:
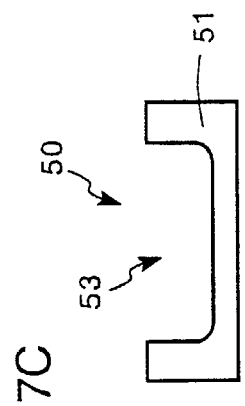

Referring to FIGS. 7A–7C, support tray 50 is an open box including four walls 51 and a flat base 52 and has a length of about 17.75 inches long, a width of about 4.25 inches, and a wall thickness of about 0.125 inches. Tray 50 is built from 5052 T6 aluminum alloy but could be constructed from any rigid, lightweight material capable of holding a flatness of about 0.10 inches. Walls 51 are about 1.375 inches high although they may be lower to accommodate taller components on the primary side of a substrate. Material is removed from portions 53 of walls 51 to reduce the mass of tray 50, as shown in FIGS. 7B and C. In one example, walls 51 are about 0.375 inches high at portions 53.

Tray 50 has one or more countersunk openings 54 permitting tray 50 to be attached to plates 30L and 30R using at least two four-millimeter flat-head screws (not shown). In one example, tray 50 has seven openings 54L, through which screws could attach tray 50 to support plate 30L and seven openings 54R, through which screws could attach tray 50 to support plate 30R. Pairs of openings 54L and 54R are labeled so that an operator may attach tray 50 to support plates 30L and 30R in a consistent position. Tray 50 also include several openings 55 through base 51 to further reduce the mass of tray 50. When tray 50 is attached to support plates 30L and 30R, labels 39L and 39R are visible through openings 55 adjacent to holes 54L and 54R.

In some examples, only one tray 50 is mounted to support plates 30, while in another example, more than one tray 50 could be mounted to support plates 30L and 30R for supporting larger boards 10.

Figure 8A:
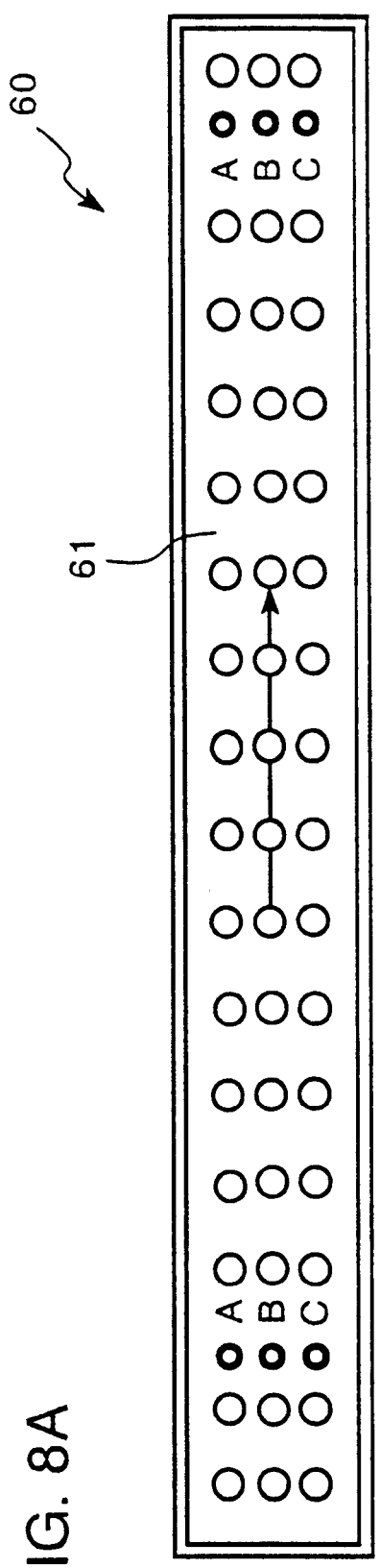
FIGS. 8A, 8B, and 8C are top, front, and right views of another support tray.
Figure 8B:
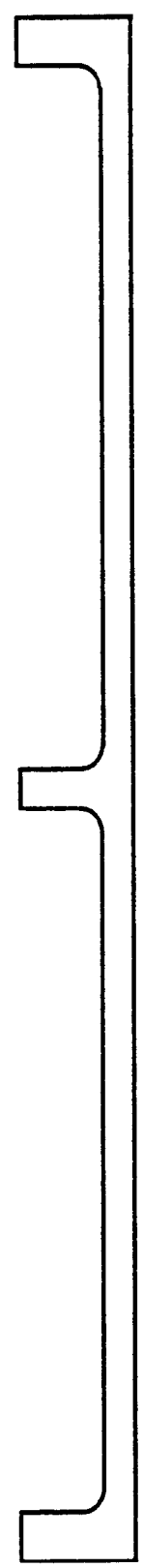
Figure 8C:

Referring to FIGS. 8A–8C, tray 60 could be a different size than tray 50 and include many of the same features of tray 50. In one example, tray 60 is an open box made 5022 T6 aluminum alloy and has dimensions of about 17.75 inches long, about 2.25 inches wide, about 1.375 inches high, and a wall thickness of about 0.125 inches. Similar to tray 50, tray 60 could be lower in height to accommodate taller components on primary side 13 of substrate 10. Foam (not shown) for tray 60 is about 17.5 inches long, about 2 inches wide and about 1.436 inches thick.

Other embodiments are within the scope of the following claims.

What is claimed is:

1. Apparatus comprising:
   a compliant member disposed beneath a substrate and configured to support the substrate during automated placement of components on the substrate; and
   a tray configured to support the compliant member and comprising a bottom wall and a rim.

2. The apparatus of claim 1 further comprising a support configured to be mounted on a component placement machine and to receive the tray.

3. The apparatus of claim 2 wherein the support comprises a support plate.

4. The apparatus of claim 2 wherein the support comprises a pair of support plates.

5. The apparatus of claim 2 wherein the support plate has openings configured to permit the tray to be mounted in different positions relative to the table of a component placement machine.

6. The apparatus of claim 1 wherein the compliant member is configured to support the substrate on a side of the substrate comprising previously placed components.

7. The apparatus of claim 1 wherein the compliant member comprises an electrically dissipative polystyrene foam.

8. The apparatus of claim 1 wherein the tray comprises at least two sets of openings configured to permit the tray to mount in at least one position to the table of a component placement machine.

9. An apparatus comprising:
   foam configured to support a substrate during automated placement of components on the substrate; and
   a tray configured to support the foam and comprising a bottom surface and a rim.

10. The apparatus of claim 9 wherein the tray comprises at least two sets of openings configured to permit the tray to mount in at least one position to the table of a component placement machine.

11. The apparatus of claim 9 wherein the support comprises a support plate.

12. The apparatus of claim 9 wherein the support comprises a pair of support plates.

13. The apparatus of claim 9 wherein the support plate has openings configured to permit the tray to be mounted in different positions relative to the table.

14. The apparatus of claim 9 wherein the foam is configured to support the substrate from a side of the substrate comprising previously placed components.

15. The apparatus of claim 14 wherein the foam comprises a grid of cuts.

16. The apparatus of claim 9 wherein the foam comprises an electrically dissipative polystyrene foam.

17. A method comprising:
   adjustably mounting a compliant member to a component placement machine;
   supporting a printed circuit board on the compliant member; and
   automatically placing components on a first side of the board.

18. The method of claim 17 further comprising detachably mounting a support to a component placement machine, said support being configured to permit adjustable placement of a compliant member.

19. The method of claim 17 further comprising detachably mounting a tray to the support, said tray being configured to receive the compliant member.

20. The method of claim 17 further comprising supporting a printed circuit board having components on a first side of the board during placement of components on a second side of the board with the compliant member.

21. Apparatus comprising:
   a compliant member configured to support a substrate during automated placement of components on the substrate;
   a tray configured to support the compliant member; and
   a support configured to be mounted on a component placement machine and to receive the tray.

22. The apparatus of claim 21 wherein the support comprises a support plate.

23. The apparatus of claim 21 wherein the support comprises a pair of support plates.

24. The apparatus of claim 21 wherein the support plate has openings configured to permit the tray to be mounted in different positions relative to the table of a component placement machine.

25. The apparatus of claim 21 wherein the compliant member is configured to support the substrate on a side of the substrate comprising previously placed components.

26. The apparatus of claim 21 wherein the compliant member comprises an electrically dissipative polystyrene foam.

27. The apparatus of claim 21 wherein the tray comprises at least two sets of openings configured to permit the tray to mount in at least one position to the table of a component placement machine.

28. An apparatus comprising:
   foam configured to support a substrate during automated placement of components on the substrate;
   a tray configured to support the foam; and
   a support configured to be mounted on a component placement machine and to receive the tray.

29. The apparatus of claim 28 wherein the support comprises a support plate.

30. The apparatus of claim 28 wherein the support comprises a pair of support plates.

31. The apparatus of claim 28 wherein the support plate has openings configured to permit the tray to be mounted in different positions relative to the table.

32. The apparatus of claim 28 wherein the foam is configured to support the substrate from a side of the substrate comprising previously placed components.

33. The apparatus of claim 32 wherein the foam comprises a grid of cuts.

34. The apparatus of claim 28 wherein the foam comprises an electrically dissipative polystyrene foam.

35. The apparatus of claim 28 wherein the tray comprises at least two sets of openings configured to permit the tray to mount in at least one position to the table of a component placement machine.

* * * * *